United States Patent [19]

Kudo et al.

[11] Patent Number: 4,842,679
[45] Date of Patent: Jun. 27, 1989

[54] METHOD FOR THE PRODUCTION OF SEMICONDUCTOR DEVICES

[75] Inventors: Hiroaki Kudo; Sadayoshi Matsui, both of Tenri, Japan

[73] Assignee: Sharp Kabushiki Kaisha, Osaka, Japan

[21] Appl. No.: 27,735

[22] Filed: Mar. 19, 1987

[30] Foreign Application Priority Data

Mar. 25, 1986 [JP] Japan .................. 61-67639

[51] Int. Cl.$^4$ .............................................. B44C 1/22
[52] U.S. Cl. ..................... 156/643; 156/664; 427/38; 427/431; 427/35; 427/53.1; 204/129.3; 204/112.35; 204/192.37; 313/231.01; 313/231.31; 313/360.1; 313/363.1; 315/111.81; 315/111.91; 250/492.3
[58] Field of Search ................ 156/627, 643, 664; 427/38, 43.1, 35, 53.1; 204/129.3, 192.32, 192.34, 192.35, 192.37; 313/231.31, 231.01, 231.41, 360.1, 363.1; 315/111.81, 111.91; 250/492.21

[56] References Cited

U.S. PATENT DOCUMENTS

| | | | |
|---|---|---|---|
| 3,679,497 | 7/1972 | Handy et al. | 427/43.1 |
| 3,928,159 | 12/1975 | Tadokoro et al. | 427/35 |
| 4,158,589 | 6/1979 | Keller et al. | 204/192.32 |
| 4,226,666 | 10/1980 | Winters et al. | 156/643 |
| 4,243,506 | 1/1981 | Ikeda et al. | 204/192.32 |
| 4,346,330 | 8/1982 | Lee et al. | 315/111.81 |
| 4,450,031 | 5/1984 | Ono et al. | 156/643 |
| 4,523,971 | 6/1985 | Cuomo et al. | 156/643 |
| 4,527,044 | 7/1985 | Bruel et al. | 315/111.91 |
| 4,574,179 | 3/1986 | Masuzawa et al. | 315/111.81 |
| 4,592,923 | 6/1986 | Kadono et al. | 427/35 |
| 4,642,522 | 2/1987 | Harvey et al. | 315/111.91 |
| 4,645,978 | 2/1987 | Harvey et al. | 315/111.81 |
| 4,661,203 | 4/1987 | Smith et al. | 156/643 |
| 4,662,977 | 5/1987 | Motley et al. | 156/643 |

FOREIGN PATENT DOCUMENTS

| | | |
|---|---|---|
| 0110468 | 11/1983 | European Pat. Off. . |
| 5987814 | 5/1974 | Japan . |
| 58147069 | 1/1983 | Japan . |
| 4944788 | 11/1984 | Japan . |
| 1191002 | 5/1967 | United Kingdom . |
| 1515571 | 5/1975 | United Kingdom . |

OTHER PUBLICATIONS

German Patent Office, Office Action (8/88) with Translation.

Primary Examiner—Kenneth M. Schor
Assistant Examiner—L. Johnson
Attorney, Agent, or Firm—Irell & Manella

[57] ABSTRACT

A method for the production of semiconductor devices comprising introducing source gases, etching gases or source molecules into a substrate to grow crystalline layers on said substrate or to etch said substrate, resulting in a semiconductor device, wherein said method further comprises applying a given electric potential to said substrate; applying an electric potential that is different from that of said substrate to an electron-beam irradiator disposed directly above said substrate; and irradiating said irradiator with electron beams from an electron-beam emitting means, whereby said substrate is irradiated with the secondary electron beams generated from said irradiator and/or with the electron beams transmitted through said irradiator.

3 Claims, 2 Drawing Sheets

METHOD FOR THE PRODUCTION OF SEMICONDUCTOR DEVICES

BACKGROUND OF THE INVENTION

1. Field of the invention:

This invention relates to a method for the production of semiconductor devices made of III-V group compounds. More particularly, it relates to a method for the production of semiconductor devices in which the heat-temperature of a substrate is reduced, resulting in high-quality crystalline layers; source gases are selectively decomposed thereby attaining composition control at the interface between the crystalline layers and composition control within the surface of each of the crystalline layers, and amount control of dopants; or the etching of the substrate is selectively achieved.

2. Description of the prior art:

A method for the production of semiconductors made of III-V group compounds, in which organic metal compounds are used, is disclosed in Japanese Patent Publication No. 49-44788. This method is disadvantageous in that, in the thermal decomposition of the organic metals and hydrides of V group compounds, when a compound semiconductor especially containing Pp such as InP, etc., is formed, a source gas such as $PH_3$ is not decomposed, but it reacts with the organic metals to form polymer intermediates such as (-InMePH-)n, and moreover, in that when the crystalline layer formation step is carried out at high temperatures, P is removed from the compound semiconductor.

In order to eliminate the above-mentioned problems, a method in which a substrate is irradiated with laser light has been proposed in, for example, Japanese Laid-Open Patent Application No. 59-87814, wherein the substrate is irradiated with laser light having energy that is equal to or higher than the decomposition energy of the organic metals and/or $PH_3$ so as to accelerate the decomposition of the source gases, and moreover, the substrate is irradiated with infrared laser light such as that from a carbon dioxide laser so as to reduce the growth temperature of the crystalline layers. However, it is extremely difficult to use such a method for the following reasons: The decomposition energy of the source gases is so high, 5–6 eV, that laser light sources having a wavelength of 200 nm or less must be used. Moreover, the most effective decomposition of the source gases can be achieved when the substrate is irradiated with laser light having energy equal to the composition energy of the source gases, but in order to achieve such decomposition, laser light sources capable of changing the wavelength of light in a wide range must be used, which is difficult to carry out. Moreover, the reduction of the growth temperature with the use of the irradiation with a carbon dioxide gas laser results in a rise of the surface temperature of the substrate, which diminishes the reduction of the said growth temperature.

Thus, the conventional use of irradiation with laser light has not yet resolved the above-mentioned problems.

On the other hand, the irradiation of a substrate with laser light is carried out so as to achieve the selective growth of semiconductor layers on the substrate based on the selective decomposition of source gases within the surface of the substrate and so as to achieve the selective etching of the substrate by the introduction of etching gases into the substrate. However, these processes require large equipment for the deflection of laser light, which causes difficulties in a practical use. For the said selective growth and the said selective etching, the use of elelctron beams instead of laser light has been proposed by, for example, S. Matsui et a., Jour. Vac. Sci & Technol. B vol. 4, Jan.-Feb., (1986). The apparatus used therefor is shown in FIG. 3, wherein a semiconductor substrate 3 disposed within a reaction tube 2 is directly irradiated with electron beams 5 from an electron gun 1, and source gases are introduced into the reaction tube 2 through the gas inlet 4. However, in order to directly irradiate the substrate 3 with the electron beams 5, the electron beams 5 must be accelerated at a level of several tens of elecfronvolts or more, so that energy of the electron beams must be several tens of electronvolts or more that is much higher than the decomposition energy of the source gases, which makes the selective decomposition of the source gases difficult, causing difficulties in composition control of grown layers. In addition, the direct irradiation of the substrate with the electron beams having high energy as mentioned above gives a high impact to the crystalline layers to be grown on the substrate, so it is sometimes difficult to obtain high-quality crystalline layers. As mentioned above, the direct irradiation of semiconductor substrates with high-energy electron beams involves many disadvantages and deficiencies.

SUMMARY OF THE INVENTION

The method for the production of semiconductor devices of this invention, which overcomes the above-discussed and numerous other disadvantages and deficiencies of the prior art, comprises introducing source gases, etching gases or source molecules into a substrate to grow crystalline layers on said substrate or to etch said substrate, resulting in a semiconductor device, wherein said method further comprises applying a given electric potential to said substrate; applying an electric potential that is different from that of said substrate to an intermediate body disposed directly above said substrate; and irradiating said body with electron beams from an electron-beam emitting means, whereby said substrate is irradiated with the secondary electron beams generated from said body and/or with the electron beams transmitted through said body.

In a preferred embodiment, the body is a grounded fine mesh grid.

In a preferred embodiment, the body is a thin plate covered with a film having a high secondary electron-radiation efficiency.

Thus, the invention described herein makes possible the objects of (1) providing a method for the production of semiconductor devices made of, e.g., III-V group compounds in which the formation of highquality crystalline layers, the selective growth of crystalline layers within the surface of a substrate, and/or the selective etching of the substrate within the surface of the substrate can be effectively attained; and (2) providing a method for the production of semiconductor devices in which activation energy is introduced into the substrate by the electron-beam irradiation, causing a decrease in the heat-temperature of the substrate and allowing for the selective decomposition of the source gases, which result in high-quality crystalline layers or in a selectively etched substrate, and therefore by the use of the highquality crystalline layers and/or the selectively etched substrate, semiconductor devices having excellent device-characteristics can be obtained.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

This invention provides a method for the production of semiconductor device in which a semiconductor substrate is irradiated with electron beams with low energy when source gases, etching gases and/or source molecules are introduced into the substrate so as to grow semiconductor layers and/or etch the substrate. According to this invention, source gases, source molecules, etc., undergo a chemical reaction by means of electron-beam energy, so that the reduction of the heat-temperature of the substrate, the prevention of the formation of intermediates, the selective growth of semiconductor layers within the surface of the substrate, the selective etching of the substrate, etc., can be carried out under control.

EXAMPLE 1

Figure 1:
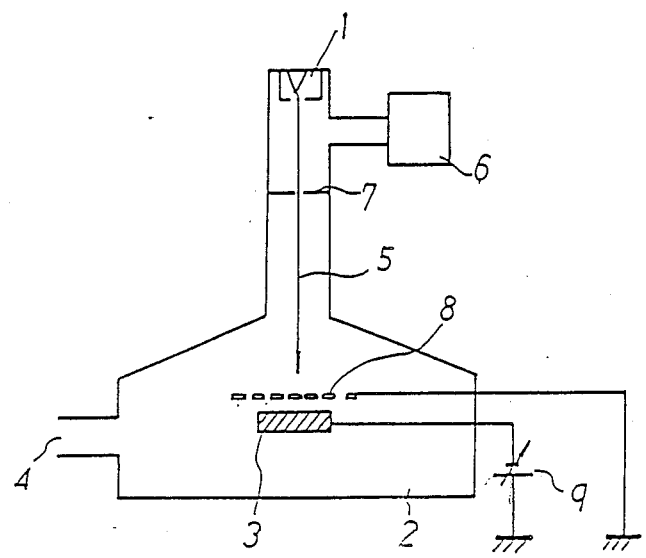
FIG. 1 is a schematic front view showing an apparatus for the production of semiconductor devices having an electron-beam irradiation function, which is used to carry out the method of this invention.

FIG. 1 shows the structure of an apparatus for the production of semiconductor devices, which is used to carry out this invention. The apparatus is constructed such that a semiconductor substrate 3 is placed in the center of a reaction tube 2 provided with an electron gun 1 on the top thereof and with a gas inlet 4 on one side thereof. The substrate 3, which is positioned just below the electron gun 1, is irradiated with electron beams 5 from the electron gun 1. The inside of the reaction tube 2 is divided by a pin hole 7 into two parts, one of which contains the said electron gun 1 therein and is evacuated by a differential vacuum pump 6 and the other of which contains the said substrate 3 therein. The upper division containing the electron gun 1 is maintained at a high vacuum level due to the pin hole 7 defining the boundary between the upper and the lower divisions. An intermediate body 8 such as a grid or metal net having a fine mesh is disposed on the path through which the electron beams 5 from the electron gun 1 irradiates the substrate 3. An electric potential Vsub is applied to the semiconductor substrate 3 by a DC power source 9. Given that the application of electric potential to the filament of the electron gun 1 is Veg, the value of Vsub can be determined by the following equation:

$$Vsub = Veg - A$$

wherein A is the electric potential (in general, a value ranging from 0 to 5 V), causing electron-beam energy to irradiate the substrate 3.

When the substrate 3 is irradiated with the electron beams 5 from the electron gun 1, the value of Veg must be set to be several tens of electronvolts or more, otherwise, a sufficient amount of electron beam cannot be obtained. For this reason, in a conventional method, the substrate 3 is irradiated with the electron beams 5 having an energy of Veg electronvolts that is sufficiently greater than the energy of A electronvolts, which caues difficulties in the selective decomposition, etc., of the reaction gases. On the contrary, in this example, the electric potential Vsub is applied to the substrate 3, so that energy of the electron beams 5 to irradiate the substrate 3 becomes the value of an electric potential difference, Veg−Vsub (i.e., A electronvolts), between the electric potential of the filament of the electron gun 1, Veg, and the electric potential of the substrate 3, Vsub. The value of Vsub can be changed as desired, so that the electron beams 5 having the desired energy can be easily applied to the substrate 3. Moreover, since the intermediate body 8, which is grounded, is disposed directly above the substrate 3, in the same manner as in a conventional method in which the substrate 3 is grounded, the electron beams 5 emitted from the electron gun 1 can be readily focused and/or deflected without any effect from the electric potential of the substrate 3.

While the substrate 3, to which the electric potential Vsub has been applied, is irradiated with the electron beams 5 from the electron gun 1 through the intermediate body 8, source gases, etching gases or source molecules are introduced into the reaction tube 2 through the gas inlet 4 so as to grow crystalline layers on the substrate 3 or so as to etch the substrate 3. By the use of the resulting substrates having the crystalline layers thereon or having the etched portions therein, a semiconductor device with uniform device-characteristics can be obtained.

EXAMPLE 2

Figure 2:
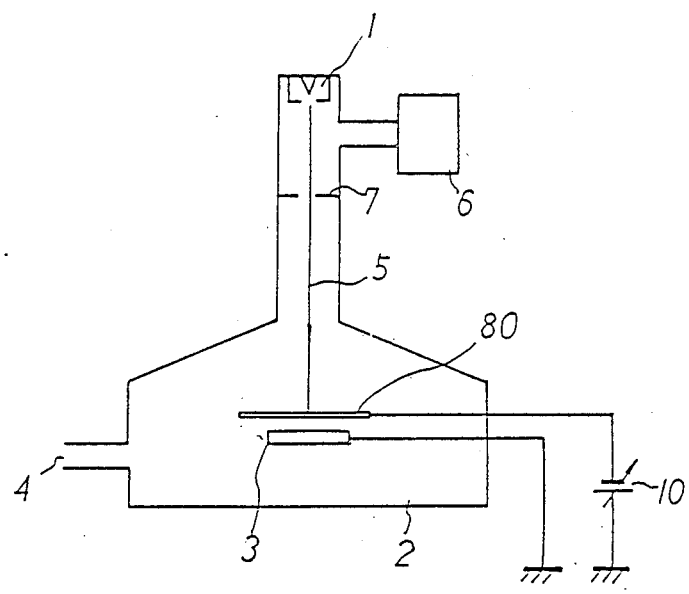
FIG. 2 is a schematic front view showing another apparatus for the production of semiconductor devices having an electron-beam irradiation function, which is used to practice the method of this invention.
Figure 3:
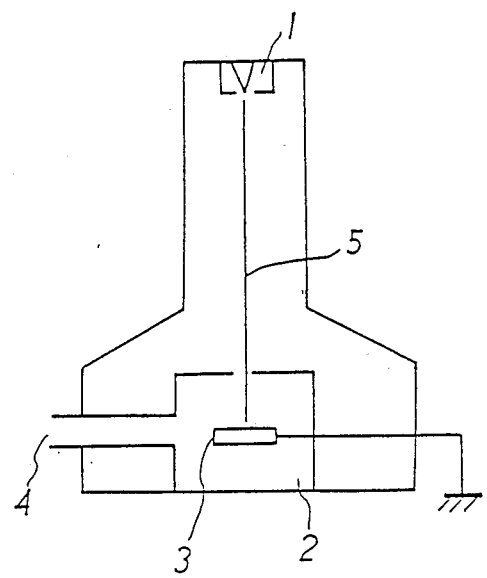
FIG. 3 is a schematic front view showing a conventional apparatus for the production of semiconductor devices.

FIG. 2 shows another apparatus for the production of semiconductor devices, which is used to carry out this invention. The portions indicated by the same reference numerals as those in FIG. 1 are designed with the same structures as those in FIG. 1. The intermeidate body 80 is a thin plate covered with a vapor-deposition film made of materials having the secondary electron-radiation efficiency at a high level, e.g., GaAs vapor-deposition film. The electron beams 5 emitted from the electron gun 1 are incident upon the electron beam-irradiator 80, first, through which some of the incident electron beams 5 are transmitted in the direction of the substrate 3. Thus, the electron beams transmitted through the body 80 (i.e., elastic scattering electron beams) then irradiate the substrate 3. At the same time, a large amount of secondary electron beam is generated from the body 80 and irradiates the substrate 3. Although the elastic scattering electron beams have the same energy as the incident beams, the amount of electron beams is sufficiently smaller than that of the unelastic scattering electron beams within the body 80. On the other hand, the amount of secondary electron beams is, in general, several ten times that of the incident electron beams, whereas the energy of secondary electron beams is small, several electronvolts. The electric potential Vta has been applied to the intermeidate body 80 by the DC power source 10. The value of Vta is the difference between the energy of the incident electron beams to irradiate the substrate 3 and the energy of the secondary electron beams to be generated from the body 80. The value of Vta can be readily changed as desired, in the same way as that mentioned in Example 1, so that electron beams having the desired energy can be easily irradiated to the substrate 3. Moreover, since the value of Vta is small, generally in the range of 0 to 10 V, there is very little influence on the incident electron beams.

It is understood that various other modificiations will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for the production of semiconductor devices comprising introducing source gases, etching gases or source molecules into a chamber having a substrate, to grow crystalline layers on said substrate or to etch said substrate, resulting in a semiconductor device, wherein said method further comprises - applying a predetermined electric potential to said substrate;

applying an electric potential that is different from that applied to said substrate to an intermediate body disposed directly above said substrate; and irradiating said body with electron beams from an electron-beam emitting means, whereby said substrate is irradiated with secondary electron beams generated from said body or is irradiated with said secondary electron beams and the electron beams transmitted through said body.

2. A method for the production of semiconductor devices according to claim 1, wherein said body is a grounded fine mesh grid.

3. A method for the production of semiconductor devices according to claim 1, wherein said body is a thin plate covered with a film having a high secondary electron-radiation efficiency.

* * * * *

UNITED STATES PATENT AND TRADEMARK OFFICE
CERTIFICATE OF CORRECTION

PATENT NO. : 4,842,679

DATED : 27 June 1989

INVENTOR(S) : Hiroaki Kudo; Sadayoshi Matsui, both of Tenri, Japan

It is certified that error appears in the above-identified patent and that said Letters Patent is hereby corrected as shown below:

In the Inventors:

Please replace "Hiroaki Kudo; and Sadayoshi Matsui, both of Tenri, Japan", with--Haruhisa Takiguchi; Shinji Kaneiwa, both of Nara, Japan; and Toshihiko Yoshida; Hiroaki Kudo; and Sadayoshi Matsui, all of Tenri, Japan--.

In the Specification:

At column 1, line 26, please replace "Pp such as InP" with--P such as InP--.

At column 1, line 50, please replace "composition energy" with--decomposition energy--.

At column 2, line 5, please replace "et a." with--et al.--.

At column 2, line 56, please replace "formation of highquality" with--formation of high-quality--.

At column 2, line 68, please replace "highquality crystalline" with--high-quality crystalline--.

At column 4, line 44, please replace "intermeidate" with--intermediate--.

At column 4, line 65, please replace "intermeidate" with--intermediate--.

Signed and Sealed this

Eighth Day of May, 1990

Attest:

HARRY F. MANBECK, JR.

Attesting Officer  Commissioner of Patents and Trademarks